United States Patent [19]

Mukai et al.

[11] Patent Number: 5,751,088
[45] Date of Patent: May 12, 1998

[54] ALTERNATOR FOR VEHICLE

[75] Inventors: Takuzou Mukai, Handa; Hiroshi Ishida, Anjyo, both of Japan

[73] Assignee: Nippondenso Co., Ltd., Kariya, Japan

[21] Appl. No.: 883,166

[22] Filed: Jun. 26, 1997

Related U.S. Application Data

[63] Continuation of Ser. No. 399,888, Mar. 7, 1995, abandoned.

[30] Foreign Application Priority Data

Mar. 11, 1994 [JP] Japan ..................... 6-067894
Feb. 3, 1995 [JP] Japan ..................... 7-017241

[51] Int. Cl.$^6$ .................... H02K 9/04; H01R 39/38
[52] U.S. Cl. .................... 310/239; 310/62
[58] Field of Search .................... 310/62, 63, 68 D, 310/239, 263, 248

[56] References Cited

U.S. PATENT DOCUMENTS

| | | | |
|---|---|---|---|
| 3,184,625 | 5/1965 | Farison | 310/59 |
| 3,198,972 | 8/1965 | Larson | 310/68 D |
| 3,230,404 | 1/1966 | Graham | 310/51 |
| 3,253,167 | 5/1966 | Bates et al. | 310/68 D |
| 3,797,242 | 3/1974 | Bowdish | 310/62 |
| 4,492,885 | 1/1985 | Kitamura | 310/62 |
| 4,517,482 | 5/1985 | Pfluger | 310/68 D |
| 4,654,551 | 3/1987 | Farr | 310/153 |
| 4,757,221 | 7/1988 | Kurihashi et al. | 310/62 |
| 4,794,285 | 12/1988 | Nimura et al. | 310/68 D |
| 4,926,076 | 5/1990 | Nimura et al. | 310/68 D |
| 5,233,255 | 8/1993 | Kusumoto et al. | 310/263 |

FOREIGN PATENT DOCUMENTS

| | | |
|---|---|---|
| 0 300 063 | 1/1989 | European Pat. Off. |
| 2 502 860 | 10/1982 | France |
| 55 97169 | 7/1980 | Japan |
| 62-203533 | 9/1987 | Japan |

Primary Examiner—Clayton E. Laballe
Attorney, Agent, or Firm—Cushman Darby & Cushman IP Group of Pillsbury Madison & Sutro

[57] ABSTRACT

In an alternator, a brush holder holds a pair of brushes which abut slip rings perpendicularly. The brush holder is disposed within an inner periphery of a cooling fan so that the brush holder overlaps with the cooling fan in the axial direction by approximately a width of a brush. The brush holder is secured to the rear housing and disposed to face an air intake window. As a result, the axial length of the alternator is reduced without sacrificing cooling capacity for the brushes.

23 Claims, 4 Drawing Sheets

ALTERNATOR FOR VEHICLE

This is a continuation of application Ser. No. 08/399,888, filed on Mar. 7, 1995 now abandoned, which was abandoned upon the filing hereof.

CROSS REFERENCE TO RELATED APPLICATION

The present application is based on and claims priority from Japanese Pat. Application No. Hei 7-17241 filed on Feb. 3, 1995, the contents of which are incorporated herein by reference.

BACKGROUND OF THE INVENTION

1. Field of the Invention

The present invention relates to an alternator for a vehicle, especially to an alternator which comprises a stator housing having a stator core, brushes and a brush holder therein and a rotor having claw poles, a cooling fan and slip rings.

2. Description of the Related Art

There is a conventional alternator disclosed in Japanese Pat. application Laid Open No. Sho 56-86052, which is shown in FIG. 4. The alternator has a front housing 31 and a rear housing 32, which are connected together by stud bolts 44 and nuts 45. In the front housing 31, a stator core 35 with a stator winding 34 wound thereon is secured and a pair of claw pole cores 36 with a field winding 37 disposed therebetween are carried by a rotary shaft 38 which is driven by a pulley 33. The rotary shaft 38 is rotatably carried by a front bearing 41 and a rear bearing 42. The pulley 33 is secured to the rotary shaft 38 by a pulley lock nut 43. Cooling fans 39 and 40 are secured to opposite ends of the pole cores 36 to intake and discharge cooling air as indicated by arrows W. A rectifying unit is disposed outside the rear housing 32 and is provided with a minus-pole heat sink 47, plus-pole heat sink 48, and diodes 49 and 50. A brush holder 46 and the rectifying unit are covered by a rear cover plate 52. A voltage regulator 51 is held between the rear housing 32 and the cover plate 52 and juts out from the cover plate 52. Slip rings 54 are disposed at the rear side of the rotary shaft 38 and brushes 53 are held in the brush holder 46 to abut the slip rings 54.

Another example of an alternator is disclosed in U.S. Pat. No. 3,184,625, in which a brush is held in parallel with a rotary shaft and another brush is held perpendicular to the rotary shaft.

A further example of an alternator is disclosed in U.S. Pat. No. 3,198,972, in which brushes held in a relatively long brush holder at the rear side of the alternator are disposed perpendicular to a rotary shaft.

Recently, an accommodation space for accessories in a vehicle engine compartment has become narrower as the size of the vehicle engine compartment has been decreasing. Reduction in size and weight of the alternator is also required for saving fuel consumption. In order to attain the reduction in size and weight of the alternator for a vehicle, it is generally required to reduce the diameter and the axial dimension thereof.

However, in the alternator disclosed in the above Japanese Pat. Application Laid Open No. Sho 56-86052, sizes of the field coil, the brush holder and the slip rings account for a significant part of the axial length of the alternator and are an obstacle to reduction of the alternator size. Further, since the brush holder is disposed outside the counter pulley-side rear bearing, cooling air generated by the counter pulley-side fan may not flow around the brush holder sufficiently.

Further, in the alternator disclosed in U.S. Pat. No. 3,184,625, since the radius of the slip ring which corresponds to the brush disposed in parallel with the rotary shaft is greater than the radius of the slip ring which corresponds to the other brush, the former brush is subject to a higher slip speed than the latter brush and wears out sooner than the latter brush. Thus a longer brush holder to accommodate a longer brush is necessary.

Still further, in the alternator disclosed in U.S. Pat. No. 3,198,972, since relatively long brushes are disposed at a rear side of the cooling fan blades, the axial length of the rear portion increases, thereby increasing the axial length of the alternator.

SUMMARY OF THE INVENTION

The present invention is made in view of the foregoing problems, and has a primary object of providing an improved alternator for a vehicle, the axial dimension and the size of which are reduced without sacrificing heat dissipation of the brush holder.

Another object of the present invention is to provide an alternator for a vehicle in which a pair of brushes are disposed perpendicular to a rotary shaft of a rotor, the brush holder is disposed within an inner periphery of the fan blades, and is positioned in a zone where the brush holder overlaps with fan blades of a cooling fan in the axial direction.

A further object of the present invention is to provide an alternator for a vehicle, wherein the zone includes at least one brush.

A still further object of the present invention is to provide an alternator for a vehicle, wherein a radially-outer end of the brush holder is disposed close to an inner periphery of the fan blades.

A still further object of the present invention is to provide an alternator for a vehicle, wherein a cooling air window is formed at a rear portion of the housing and the brush holder is disposed to face the cooling window.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENT

A preferred embodiment according to the present invention will now be described with reference to the appended drawings.

Figure 1:
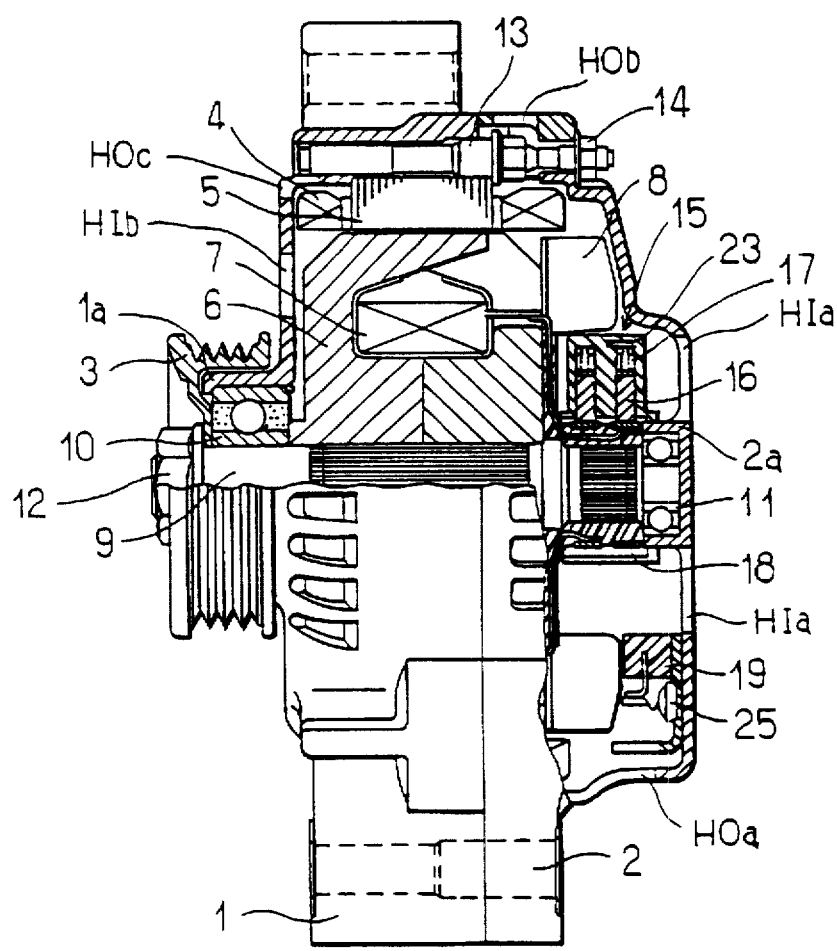
FIG. 1 is a cross-sectional view illustrating an overall structure of an embodiment according to the present invention.

In FIG. 1, an outer periphery member of the alternator consists of aluminum die-cast front housing 1 and rear housing 2, which are connected by a plurality of stud bolts 13 and nuts 14. An air intake window H1b, an air outlet window H0c and the like are formed in the front housing 1. An air intake window H1a and air outlet windows H0a and H0b are formed in the rear housing 2. In order to carry a rotary shaft 9, a front bearing 10 is secured to the front housing 1 and a rear bearing 11 is secured to the rear housing 2 respectively at their boss portion 1a and 2a by way of press-fitting and squeezing. The shaft 9 is press-fitted to a pair of claw pole cores (field core) 6 in which a field coil 7 is disposed and to slip rings 18 to form a rotor. A stator core (armature core) 5 is secured inside the front housing 1 around the pole core 6 and forms a stator with a stator coil 4 of 2π/3 short pitch multi-phase windings wound in slots of the stator core 5. There are a brush holder 15, a rectifying unit 19, voltage regulator (not shown) and other electrical parts disposed in the rear housing 2. The brush holder 15 is disposed radially inside the cooling fan 8. The rectifying unit 19 has a plurality of diodes 25 secured respectively on a plus pole heat radiation fin and a minus pole heat radiation fin. The rotary shaft 9 is respectively press-fitted to inner members of the front and rear bearings 10 and 11, and the front bearing 10 of the rotary shaft 9 is press-fitted and secured to the inside of the boss portion 1a which extends forward from the front housing 1. The rotary shaft 9 also carries the pulley 3 which has a recess to receive the boss portion 1a therein. The recess is formed to have a distance between its bottom and a loading center of the pulley which is about 2 mm to 8 mm shorter than a distance between the end of the front bearing 10 and a loaded center of the front bearing 10. The pulley 3 is tightly secured to the rotary shaft 9 by a pulley lock nut 12 in such a manner that a bottom of the pulley's recess abuts an end of the inner member of the front bearing 10. The cooling fan 8 has a plurality of fan blades welded to the rear side (counter pulley side) of the rotor 6. The slip rings 18 are molded into a unit with the cooling fan 8.

Figure 2:
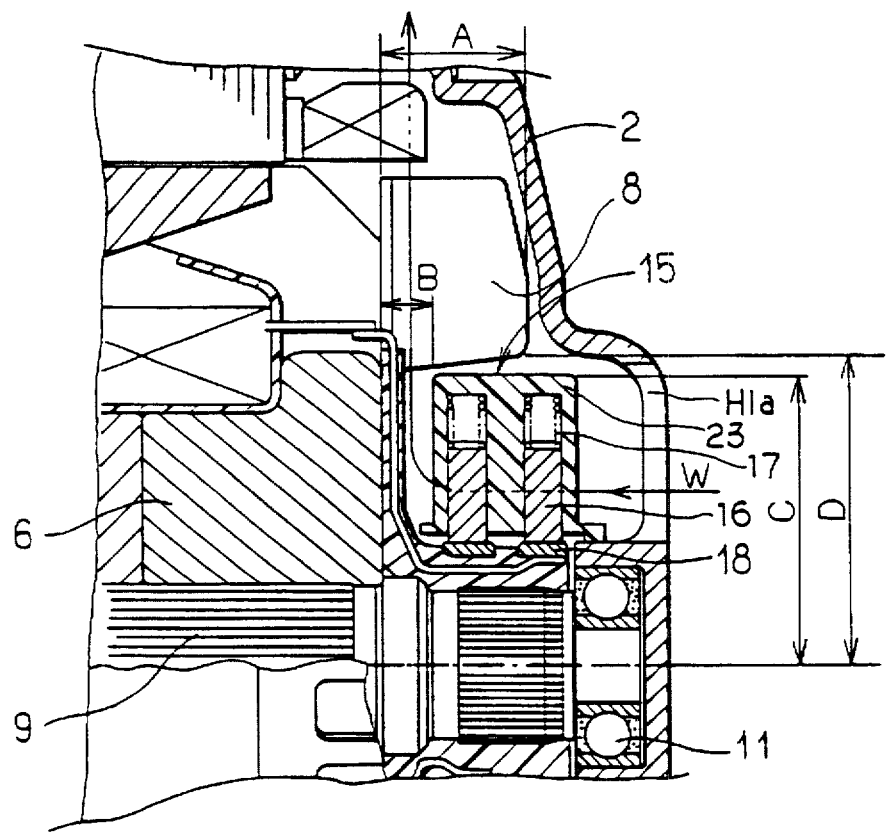
FIG. 2 is an enlarged partial view illustrating a portion around a brush holder shown in FIG. 1.
Figure 3:
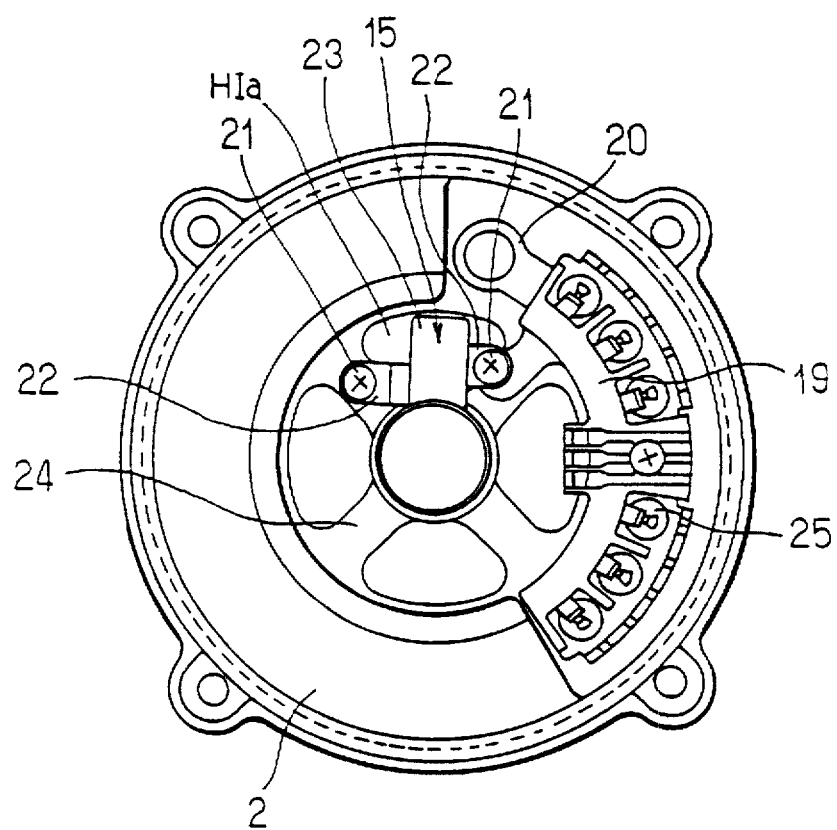
FIG. 3 is a plan view illustrating the brush holder being installed in a rear housing shown in FIG. 1.
Figure 4:
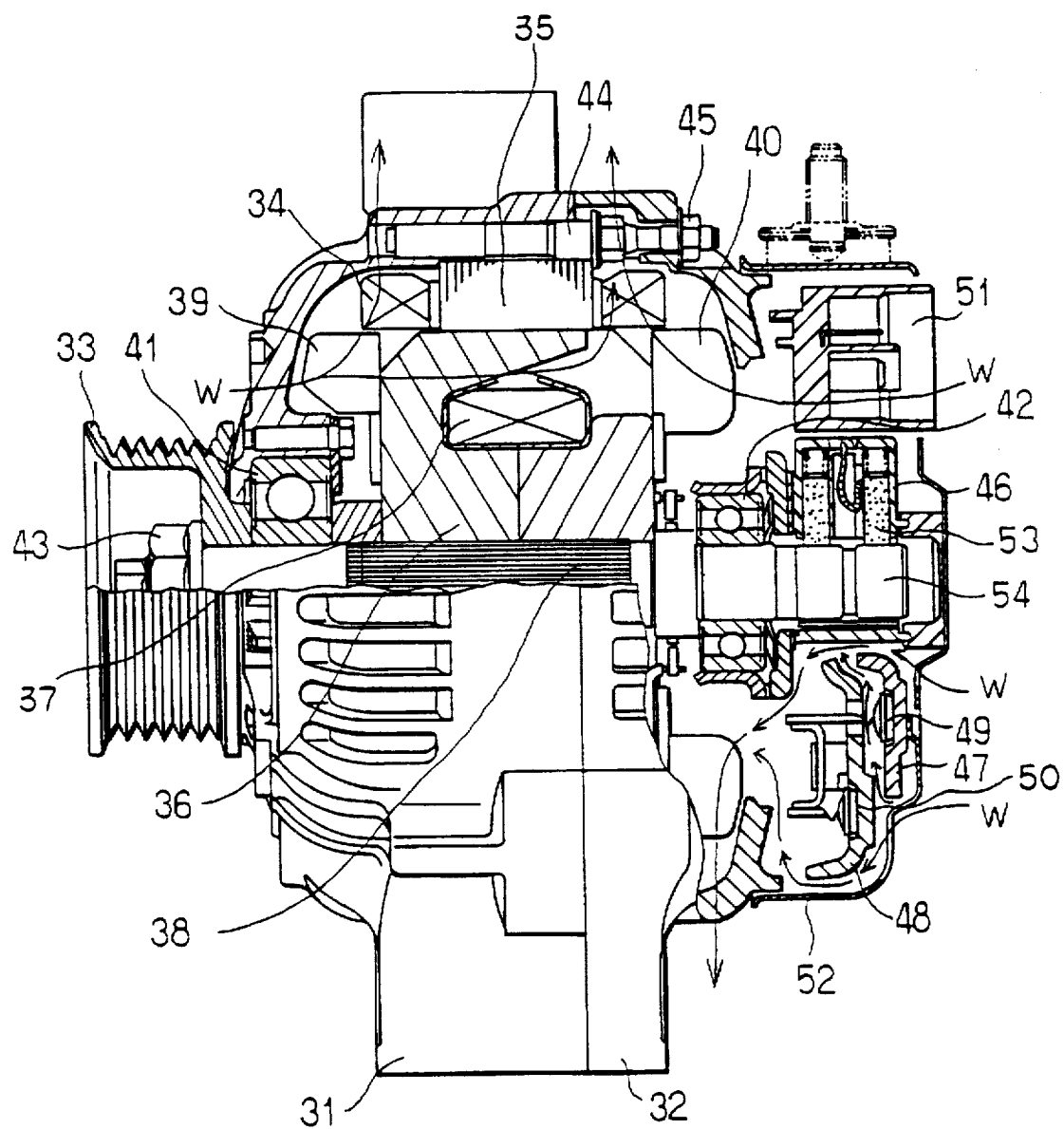
FIG. 4 is a cross-sectional view illustrating the overall structure of a prior art device.

As shown in FIGS. 2 and 3, the brush holder 15 has a brush case 23 made of resinous material, a pair of brushes 16 and springs 17. The brushes 16 are held in the brush case 23 to extend perpendicular to the rotary shaft 9 and biassed by the springs 17 against the slip rings 18. The brush holder 15 is positioned within an area having a diameter C which is slightly smaller than the diameter of the inner periphery of the fan and its front-side brush is located within a zone having width A of the fan blades of the cooling fan 8. That is, the brush holder 15 and the cooling fan 8 overlap axially with each other in the zone B by approximately one brush width.

As shown in FIG. 3, the brush holder 15 is secured to rib members 24 between the air intake windows H1a inside the rear housing 2 by a metal holder 22 and screws 21. The brush case 23 is positioned to face the air intake windows H1a to receive a sufficient amount of cooling air. The rectifying unit 19 rectifies output current generated in the stator coil 4.

In the alternator of the embodiment described above, cooling air is introduced into the rear housing through the air intake window H1a to flow around the brush holder and the brushes, along the shaft and is discharged from the air outlet windows H0a and H0b. Therefore, sufficient cooling air is supplied to the brush holder and brushes. In particular, the front side brush, where temperature rise is otherwise significant, receives a sufficient amount of cooling air to dissipate generated heat, thereby reducing the axial size of the brushes and brush holder.

The front housing 1 and the rear housing 2 may be replaced by press-formed material like iron plate or laser-cut iron block instead of the die-cast aluminum.

In the foregoing discussion of the present invention, the invention has been described with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than a restrictive, sense.

What is claimed is:

1. An alternator for a vehicle, comprising:
   a front housing, having a front bearing;
   a rear housing, having an air intake window and a rear bearing;
   a stator having an armature coil;
   a rotor having a plurality of claw poles, a field coil, a cylindrical slip ring member connected to said field coil and a shaft press-fitted into said claw poles and said slip ring member, said shaft being carried by said front and rear bearings;
   a pulley carried by said shaft and driven by an engine;
   a cooling fan having a plurality of fan blades and secured to said rotor at a side opposite said pulley;
   a brush member secured to said rear housing and having a brush holder and a pair of radially extending front and rear brushes, said pair of radially extending front and rear brushes being held in said brush holder and abutting perpendicularly said slip ring member, at least one of said radially extending front and rear brushes and a corresponding portion of the brush holder being positioned within an inner periphery of said fan blades to overlap with said fan blades in the axial direction and so as to face said air intake window, said brush holder having a radially extending surface, at least a portion of said radially extending surface intersecting an axial flow of cooling air, whereby cooling air is introduced through said air intake window to flow around said brush holder and brushes.

2. An alternator for a vehicle according to claim 1, wherein said brush holder overlaps with said fan blades by approximately a width of said front brush.

3. An alternator for a vehicle according to claim 2, wherein said armature winding comprises 2π/3 short pitch multi-phase windings.

4. An alternator for a vehicle according to claim 3, wherein said pulley has a recess with its bottom abutting said front bearing so that distance between said bottom and a loading center of said pulley is 2 mm to 8 mm shorter than distance between said bottom and a loaded center of said front bearing.

5. An alternator for a vehicle according to claim 3, wherein said slip ring member comprises a pair of slip rings as an integral unit of resinous material.

6. An alternator for a vehicle, comprising:
   a pair of front and rear housings for accommodating a stator with an armature coil said rear housing having an air-intake window;
   a rotor having claw pole cores, a magnetic-field coil, a pulley to be driven by an engine, a cooling fan secured to said rotor at an end opposite said pulley and having a plurality of blades, and cylindrical slip rings;
   brush means secured to said rear housing and having a brush case and a pair of radially extending brushes abutting said slip rings perpendicularly, at least one of said radially extending brushes being disposed within an inner periphery of said fan blades to face said air-intake window and being disposed in a zone where said holder member overlaps with said fan blades in the axial direction.

7. An alternator for a vehicle according to claim 6, wherein said housing has cooling air windows and a rib member formed between said windows; and said brush holder is secured to said rib member.

8. An alternator for a vehicle according to claim 7, wherein a radially outer-end of said brush holder is disposed proximate to an inner periphery of said fan blades.

9. An alternator for a vehicle according to claim 6, wherein said brush holder overlaps with said fan blades by approximately a width of said brushes.

10. An alternator for a vehicle according to claim 6, wherein said slip rings are molded integral with said cooling fan.

11. An alternator for a vehicle, comprising:

a front housing having a front boss portion and a front ring secured to said front boss portion, said front bearing having a loaded center;

a rear housing having a rear bearing rib members and an air intake window between said rib members;

a stator having an armature coil;

a rotor having a plurality of claw poles, a field coil, a cylindrical slip ring member connected to said field coil and a shaft press-fitted into said claw poles and said slip ring member, said shaft being carried by said front bearing at said loaded center and said rear bearing;

a pulley carried by said shaft proximate said front bearing to receive a driving force at a loading center thereof, said pulley having a recess receiving said front boss portion, said loading center of said pulley and said loaded center of said front bearing being offset from one another;

a cooling fan having a plurality of fan blades, said fan being secured to said rotor at a side of said rotor opposite said pulley; and a brush member secured to at least one of said rib members to face said air intake window and having a brush holder and a pair of radially extending front and rear brushes held in said brush holder, said pair of radially extending front and rear brushes being disposed perpendicular to said shaft, at least one of said pair of radially extending front and rear brushes and a corresponding portion of the brush holder being positioned within an inner periphery of said fan blades to overlap with said fan blades in the axial direction, said brush holder having a radially extending surface, at least a portion of said radially extending surface intersecting an axial flow of cooling.

12. An alternator for a vehicle according to claim 11, wherein the offset distance between said loading center of said pulley and said loaded center of said front bearing is between 2 mm and 8 mm.

13. An alternator for a vehicle, comprising:

a front housing having a front boss portion and a front bearing secured to said front boss portion, said front bearing having a loaded center;

a rear housing having a rear bearing and an intake air window;

a stator having an armature coil;

a rotor having a plurality of claw poles, a field coil, a cylindrical slip ring member connected to said field coil and a shaft press-fitted into said claw poles and said slip ring member, said shaft is carried by said front bearing at said loaded center and said rear bearing;

a pulley carried by said shaft proximate said front bearing to receive a driving force at a loading center thereof, said pulley having a recess receiving said front boss portion, said loading center of said pulley and said loaded center of said front bearing being offset from one another;

a cooling fan, having a plurality of fan blades, secured to said rotor at a side of said rotor opposite said pulley, said slip ring member being integral with said cooling fan; and a brush member having a brush holder and a pair of radially extending front rear brushes, said pair of brushes being held in said brush holder and abutting perpendicularly said slip ring member, at least one of said pair of radially extending front and rear brushes and a corresponding portion of said brush holder being positioned, at a portion of said rear housing so as to face said air intake window, within inner periphery of said blades fan blades to overlap with said fan blades in the axial direction said brush holder having a radially extending surface, at least a portion of said radially extending surface intersecting an axial flow of cooling air.

14. An alternator for a vehicle according to claim 13, wherein the offset distance between said loading center of said pulley and said loaded center of said front bearing is between 2 mm and 8 mm.

15. An alternator for a vehicle, comprising:

a front housing having a front boss portion and a front bearing secured to said front boss portion, said front bearing having a loaded center;

a rear housing having a rear bearing, an air intake window and rib members;

a stator having an armature coil;

a rotor having a plurality of claw poles, a field coil, a slip ring member connected to said field coil and a shaft press-fitted into said claw poles and said slip ring member, said shaft being carried by said front bearing at said loaded center and a rear bearing;

a pulley carried by said shaft proximate said front bearing to receive a driving force at a loading center thereof, said pulley having a recess receiving said front boss portion, said loading center of said pulley and said loaded center of said front bearing being offset from one another;

a cooling fan having a plurality of fan blades and being secured to said rotor at a side of said rotor opposite said pulley, said slip ring member being integral with said cooling; and a brush member secured to said rib members to face said air intake window of said rear housing, said brush member having a brush holder and radially extending front and rear brushes held in said brush holder and disposed perpendicular to said shaft, at least one of said pair of radially extending front and rear brushes and a corresponding, portion of said brush holder being positioned within an inner periphery of said fan blades to overlap with said fan blades in the axial direction, said brush holder having a radially extending, surface, at least a portion of said radially extending surface intersecting an axial flow of cooling air.

16. An alternator for a vehicle according to claim 15, wherein the offset distance between said loading center of said pulley and said loaded center of said front bearing is between 2 mm and 8 mm.

17. An alternator for a vehicle, comprising:

a front housing having a front boss portion and a front bearing secured to said front boss portion;

a rear housing having a rear bearing, rib members and an air intake window between said rib members;

a stator having an armature coil, armature winding of said armature coil comprising 2π/3 short pitch multi-phase windings;

a rotor having a plurality of claw poles, a field coil, a slip ring member connected to said field coil and a shaft press-fitted into said claw poles and said slip ring member, said shaft being carried by said front and rear bearings;

a pulley carried by said shaft proximate said front bearing, said pulley having a recess receiving said front boss portion;

a cooling fan, having a plurality of fan blades, secured to said rotor at a side of said rotor opposite said pulley;

a brush member secured to said rib member to face said intake window of said rear housing and having a brush holder and a pair of radially extending front and rear brushes held in said brush holder, said pair of radially extending front and rear brushes disposed perpendicular to said shaft, at least one of said pair of radially extending front and rear brushes and a corresponding portion of said brush holder being positioned within an inner periphery of said fan blades to overlap with said fan blades in the axial direction, said brush holder having a radially extending surface, at least a portion of said radially extending surface intersecting an axial flow of cooling.

18. An alternator for a vehicle according to claim 17, wherein said brush holder overlaps with said fan blades by approximately a width of said front brush.

19. An alternator for a according to claim 18, wherein said slip ring member comprises a pair of slip rings as an integral unit with said cooling fan.

20. An alternator for a vehicle, comprising:

a front housing having a front boss portion and a front bearing secured to said front boss portion;

a rear housing having a rear bearing, rib members and an air intake window between said rib members;

a stator having an armature coil, armature winding of said armature coil comprising 2π/3 short pitch multi-phase windings;

a rotor having a plurality of claw poles, a field coil, a slip ring member connected to said field coil and a shaft press-fitted into said claw poles and said slip ring member, said shaft being carried by said front and rear bearings;

a pulley carried by said shaft proximate said front bearing, said pulley having a recess receiving said front boss portion;

a cooling fan having a plurality of fan blades and being secured to said rotor at a side of said rotor opposite said pulley, said slip ring member being integral with said cooling fan;

a brush member secured to said rear housing and having a brush holder and radially extending front and rear brushes held in said brush holder, said radially extending front and rear brushes being disposed perpendicular to said shaft, at least one of said radially extending front and rear brushes and a corresponding portion of said brush holder being positioned at a portion of said rear housing to face said air intake window within an inner periphery of said fan blades to overlap with said fan blades in the axial direction, said brush holder having a radially extending surface, at least a portion of said radially extending surface intersecting an axial flow of cooling air.

21. An alternator for a vehicle according to claim 20, wherein said brush holder overlaps with said fan blades by approximately a width of said front brush.

22. An alternator for a vehicle, comprising:

a front housing having a front boss portion and a front bearing secured to said front boss portion, said front bearing having a loaded center;

a rear housing having a rear bearing, rib members and an air intake window between said rib members;

a stator having an armature coil, armature winding of said armature coil comprising 2π/3 short pitch multi-phase windings;

a rotor having a plurality of claw poles, a field coil, a slip ring member connected to said field coil and a shaft press-fitted into said claw poles and said slip ring member, said shaft being carried by said front and rear bearings;

a pulley carried by said shaft proximate said front bearing, said pulley having a recess receiving said front boss portion;

a cooling fan, having a plurality of fan blades, secured said rotor at a side of said rotor opposite said pulley, said slip ring member being molded integral with said cooling fan; and a brush member secured to said rear housing and having a brush holder and a pair of radially extending front and rear brushes held in said brush holder, said pair of radially extending front and rear brushes disposed perpendicular to said shaft, at least one of said pair of radially extending front and rear brushes and a corresponding portion of said brush holder being positioned at a portion of said rear housing to face said air intake window within an inner periphery of said fan blades to overlap with said fan blades in the axial direction, said brush holder having a radially extending surface, at least a portion of said radially extending surface intersecting an axial flow of cooling air.

23. An alternator for a vehicle according to claim 22, wherein said brush holder overlaps with said fan blades by approximately a width of said front brush.

\* \* \* \* \*